United States Patent [19]

Fontanes

[11] 3,909,824

[45] Sept. 30, 1975

[54] NON-LINEAR ANALOGUE-DIGITAL CONVERTER FOR COMPRESSION CODING

[75] Inventor: Sylvain Fontanes, Chatou, France

[73] Assignee: Compagnie Europeenne de Teletransmission (C.E.T.T.), Paris, France

[22] Filed: July 23, 1974

[21] Appl. No.: 491,138

[30] Foreign Application Priority Data

July 27, 1973 France .............................. 73.27575

[52] U.S. Cl....................... 340/347 NT; 340/347 AD

[51] Int. Cl.$^2$.......................................... H03K 13/20

[58] Field of Search.............. 340/347 NT, 347 AD; 324/99 D; 235/183

[56] References Cited

UNITED STATES PATENTS

| | | | |
|---|---|---|---|
| 3,749,894 | 7/1973 | Avdeef | 340/347 NT |
| 3,842,416 | 10/1974 | Eto | 340/347 NT |

*Primary Examiner*—Charles D. Miller
*Attorney, Agent, or Firm*—Cushman, Darby & Cushman

[57] ABSTRACT

Two integrators are charged proportionally to the sampled analogue signal, but with different proportionality coefficients, the first integrator being used for coding the lower (in absolute value) amplitudes, and the second one the higher amplitudes.

They are discharged according to non-linear laws so that the discharge time of the first one be proportional to the compressed amplitude for lower sampled amplitudes and that of the second one to the compressed amplitude for higher sampled amplitudes, the proportionality coefficient being this time the same for both integrators.

According to whether the absolute value of the charge of the second integrator has reached or not a threshold value, clock pulses are fed to a counter for the duration of the discharge time of the second or of the first integrator.

4 Claims, 4 Drawing Figures

NON-LINEAR ANALOGUE-DIGITAL CONVERTER FOR COMPRESSION CODING

The present invention relates to an analogue-digital converter comprising a non-linear basic converter comprising an integrator, first means for charging the integrator in proportion with the amplitude of the sampled analogue signal, and second means for discharging the integrator as a function of time, in accordance with a characteristic constituted by a succession of straight line segments, the discharge time being measured by counting fixed frequency pulses.

An arrangement of this kind has already been proposed in German Patent Application (Offenlegungsschrift) No. 1 940 885, for use in the correction of analogue signals coming, for example from measuring instruments whose output voltage does not increase linearly with the measured quantity. More precisely, the device described achieves a non-linear conversion by a variation, as a function of time, either of the discharge voltage source or of the frequency of the counting pulses.

However, this arrangement cannot be used for the compression of signals in accordance with a law whose slope varies within wide limits, for example the law illustrated in FIG. 1 which is intended for use in accordance with European standards where 30 telephone channels are regrouped within a frame transmitted at 2048 kilobits per second.

The reasons for this are as follows:

a. This standardisation requires a ratio of 128 between the highest and lowest discharge currents, and consequently the use of an input amplifier having a very high input impedance (of the order of 50 megohms) and very low drift.

b. The comparators used at the output of the integrator must react extremely fast (less than 100 ns) to overstepping of a low threshold (less than 1 mV).

The object of the present invention is to overcome these drawbacks. The problem which is tackled in this context is that of automatically carrying out different processing respectively of the low values and of the high values of the analogue input signal, and as an accessory to this, more convenient control of the discharge currents by the known utilisation of integrators having multiple discharge time constants.

According to the invention, there is provided an analogue-digital converter for coding an analogue signal and simultaneously compressing it according to a compression characteristic $A' = f(A)$, where A is the amplitude to be coded and compressed, and A' the value of the corresponding coded signal, said characteristic being formed by a succession of straight line segments having $q$ different slopes, $q$ being an integer greater than $p$, the latter being an integer greater than one, and the segments having the $p$ steepest slopes corresponding to those amplitudes A which are, in absolute value, smaller than a threshold value, said analogue-digital converter comprising:

a first arrangement, including an integrator having an output, for, during first recurrent predetermined time intervals, sampling said analogue signal and charging said integrator proportionally to the amplitude of the sampled analogue signal, at least if the absolute value of this amplitude is not higher than said threshold value, with a first proportionality coefficient; means, for, in the course of further time intervals respectively following said first time intervals, non-linearly discharging said integrator as a function of time through modifying the discharge time constant of said integrator according to a predetermined programme so that the discharge time be proportional to the absolute value of the value A' corresponding to the amplitude of the sampled analogue signal, at least if the absolute value of this amplitude is not higher than said threshold value, with a second proportionality coefficient;

a second arrangement including a further integrator having an output, means for, during said first time intervals, sampling said analogue signal and charging said further integrator proportionally to the amplitude of the sampled analogue signal with a third proportionality coefficient smaller than said first proportionality coefficient; means, for in the course of said further time intervals, non-linearly discharging said further integrator as a function of time, through modifying the discharge time constant of said further integrator according to a further predetermined programme so that the discharge time be proportional to the absolute value of the value A' corresponding to the amplitude of the sampled analogue signal at least if the absolute value of this amplitude is higher than said threshold value, with a proportionality coefficient equal to said second proportionality coefficient;

pulse counting means, including a pulse generator for delivering pulses at a fixed frequency and a counter;

control means, coupled to the output of one of said integrators, for causing the feeding of said pulses to said counter during the discharge time of said further integrator or of said integrator of said first arrangement according to whether the absolute value of the charge of that integrator to the output of which said control means are coupled has or has not reached, at the end of the time interval during which said two integrators were charged, a limiting value indicating that the absolute value of the amplitude of the corresponding sampled analogue signal was at least equal to said threshold value.

The invention will be better understood and other of its features rendered apparent from a consideration of the ensuing description and the related drawings in which.

Figure 1:
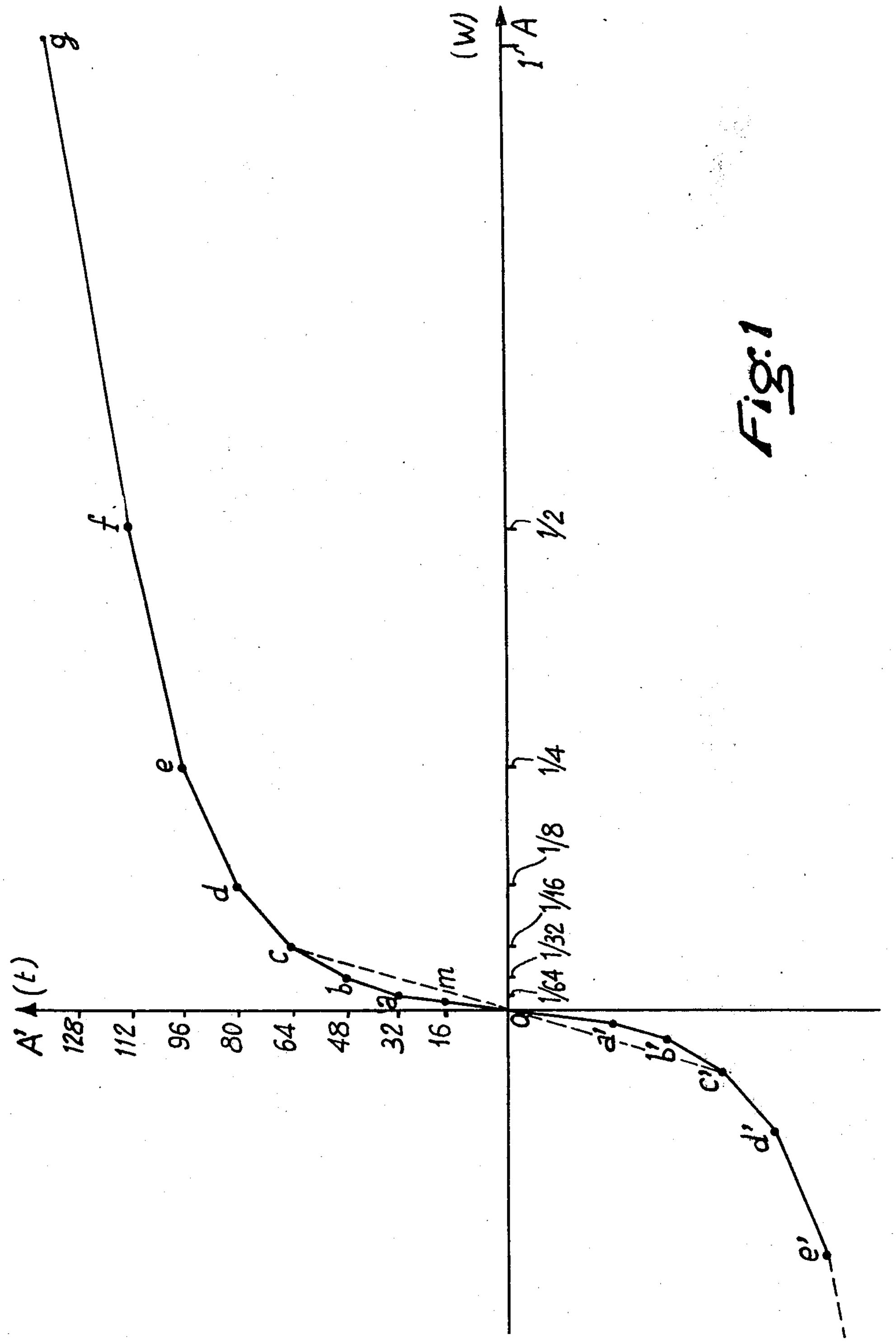
FIG. 1 shows the characteristic of a known quasi-logarithmic compression law.

In FIG. 1, a known compression characteristic used in Europe, has been shown. The real amplitudes have been plotted on the abscissae and the compressed amplitudes A' on the ordinates. This characteristic is formed by 13 straight line segments and is symmetrical in relation to the origin 0 of the axes, a point having negative coordinates symmetrical with a similar point having positive coordinates, being marked by the same letter but with the addition of a prime. The central segment $a'a$, corresponds half with positive values of A and half with negative values of A. In the drawing, the negative part of the law has been shown only in part. It is sufficient to describe the positive part: the slope of each segment is half the slope of the preceding segment. The axis of the A′ values is graduated in quantised steps numbering 128. The axis of the A values is graduated in fractions of the maximum absolute value $A_M$ of A. The intersections between the successive segments commencing from the central segment, have the respective abscissae and ordinate values: *a:* 1/64 and 32; *b:* 1/32 and 48; *c:* 1/16 and 64; *d:* 1/8 and 80; *e:* 1/4 and 96; *f:* 1/2 and 112; the coordinates at the end *g* being 1 and 128. The curve approximates to a base 2 logarithmic law.

Taking the positive amplitudes A only, the law shown in FIG. 1 corresponds to 128 quantising steps which can be identified by 7 bits. The negative amplitudes have the same steps, the identification of the polarity being effected by an eighth sign bit, for example 1 for + and 0 for –. We will consider also the characteristic limited in the figure by the points c and c′, this involving only the contral segment and two segments at either side, the quantised amplitude steps (in terms of absolute value) being thus reduced to 64 and the amplitude A then only covering the corresponding interval. The positive part of this limited characteristic, has been shown at a larger abcissae scale in FIG. 2; the abscissae values of the points a and b are here the values which are obtained by assigning the value 1 to the abscissa of *c*.

Figure 3:
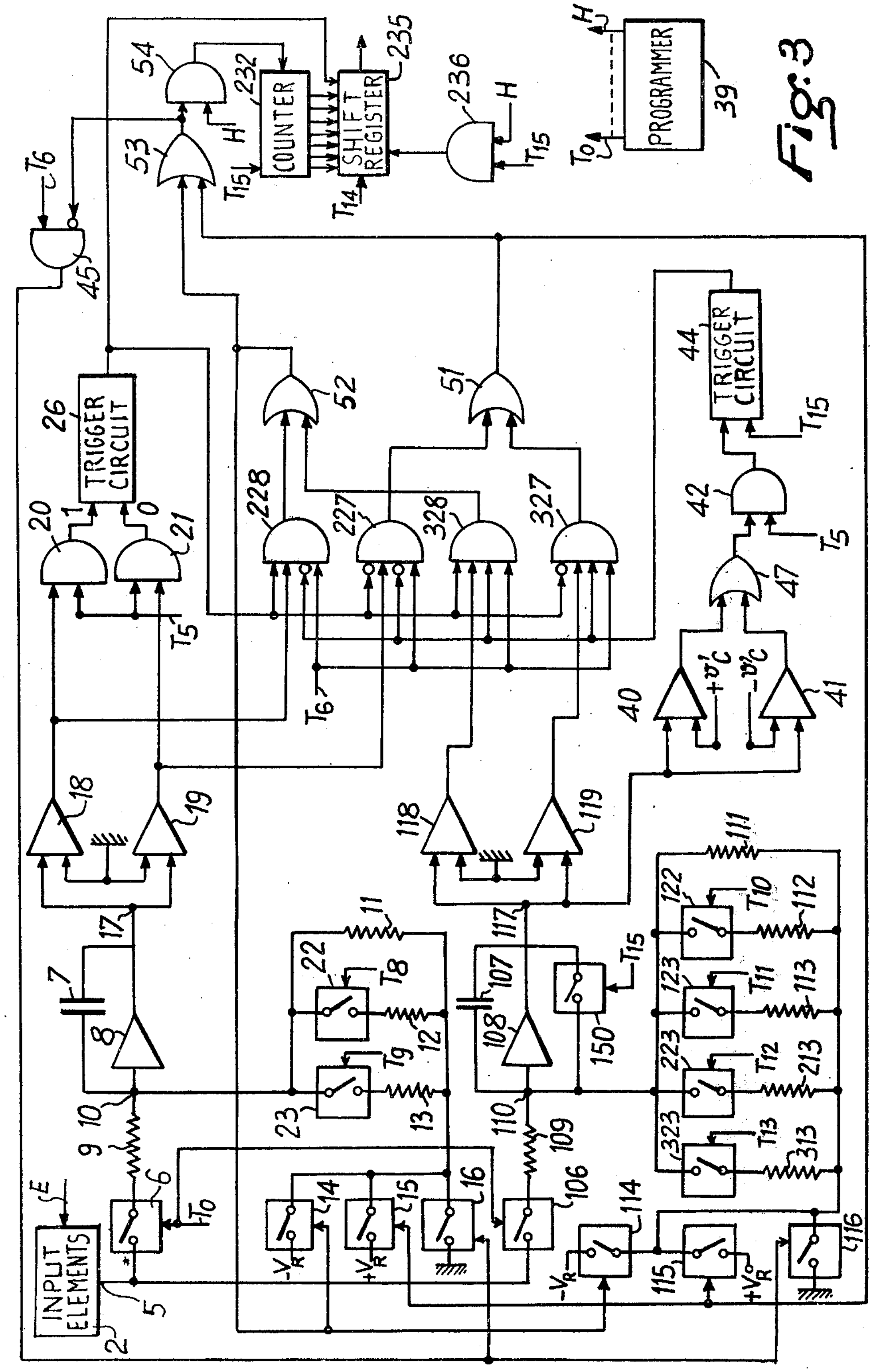
FIG. 3 is a diagram of an embodiment of the coder-compressor in accordance with the invention, which utilises the compressor characteristic shown in FIG. 1.

The coder-compressor of FIG. 3 can be used with the characteristic shown in FIG. 1 where the amplitude (in terms of absolute value, this will be taken as understood henceforth) will be defined by a number of 7 bits. In FIG. 3, all the switches breakers are of electronic design and each of them has been shown, in the manner currently accepted, as a block having a signal input, an output and a control input, althrough in order to facilitate the understanding of the figure, the connection which is made or broken is symbolised inside the block by means of mechanical contact breakers.

The coder-compresser comprises, working from the input E, a block 2 symbolising the conventional input elements of a coder, namely a capacitor, a resistor and a feedback amplifier having a relatively high input impedance and gain.

Figure 4:
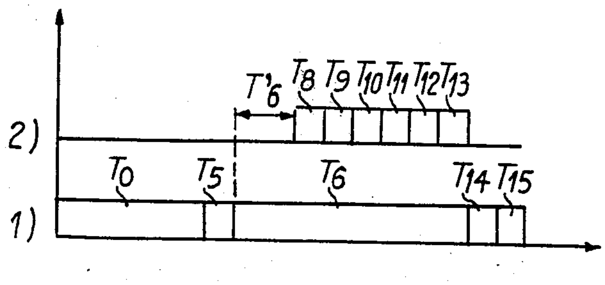
FIG. 4 is a time-base diagram illustrating the operation of the coder-compressor of FIG. 3.

Over a sampling period P of for example 125 $\mu s$ divided into 16 elementary time intervals of duration D commencing at the instants $t_o$, $t_1 \ldots t_{15}$, a programmer 39 supplies the signals shown in FIG. 4; each signal, starting at an instant $t_i$, is designated by the letter T with the numerical index *i*.

Periodically, the programmer produces a signal $T_o$ lasting 5D, a signal $T_5$ lasting D, a signal $T_6$ lasting 8D and two signals $T_{14}$ and $T_{15}$ each lasting D, which succeed one another without interruption to cover a sampling period P. These signals have been illustrated at 1) in FIG. 4.

Superimposed in time on these signals, there are six signals $T_8$ to $T_{13}$ each of duration D, covering the last part (6D) of the time interval $T_6$.

The reference $T_n$ will be used indiscriminately to designate a signal $T_n$ as well as the time interval which it covers. The reference $T'_6$ will be employed to designate the time interval (unmarked by a signal from the programmer) separating the time intervals $T_5$ and $T_8$. The programmer furthermore delivers clock pulses H. In the drawing, the connections between the programmer and the inputs which receive the signals from it, have not been shown, these inputs being indicated by the same symbols as the signals which they receive.

Figure 2:
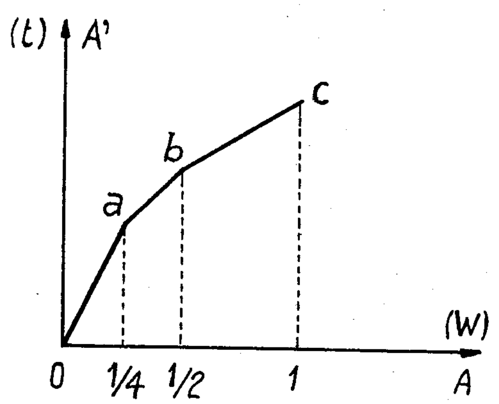
FIG. 2 is an explanatory diagram reproducing part of the characteristic shown in FIG. 1.

The device comprises two integrators, coupled to the output 5, of the input circuit E, throught a switch 6, the first integrator being intended to process low amplitudes, corresponding to the part c′c of the law depicted in FIG. 1, the positive part of which has been shown on an enlarged scale in FIG. 2, and the second designed to process the high amplitudes. Both, at the beginning of each sampling period, are charged in the course of the time interval $T_o$ during which the switch is closed. Depending upon whether, at the end of the time interval $T_o$, the output signal from the second integrator does or does not exceed in absolute value, the value $v'_c$ corresponding to an amplitude $A_M$/16 of the input signal, either the second or the first integrator will be used.

First of all, the structure and operation of the first integrator will be described, assuming that the sampled amplitude corresponds throughout to the part *c′c* of the law depicted in FIG. 1. The second integrator is then prevented from causing any output signals, in the manner which will be described hereinafter. This being the case, the output 5 of the input circuit 2 is connected to the input of the first integrator through switch 6. The integrator is an integrator-amplifier comprising a capacitor 7 connected between the input 10 and the output 17 of an amplifier 8, said output 17 forming the output of the integrator; the resistor 9 determines, in association with the capacitance of the capacitor 7, the charging time constant, and is arranged between the output of the switch and the input 10 of the amplifier.

Three other resistors 11, 12 and 13 connected by their second terminals, enable three discharge time constants to be defined. The first terminals of the resistors 12 and 13 can be connected to the first terminal of the resistor 11 respectively through switches 22 and 23. The first terminal of the resistor 11 is connected to the terminal 10 and its second terminal can be connected through three switches 14, 15 and 16, to a voltage source $-V_R$, a voltage source $+V_R$ and ground.

At the instant $t_o$ the switch 6 is closed under the control of the signal $T_o$. The resistor 9 has a resistance which is determined a function of the capacitance of the capacitor 7 so that the integrator is charged substantially at constant current during the time interval $T_o$. At the instant $t_5$, the voltage *v* at the output 17 of the amplifier 8 has a final value V proportional to A. The discharge of the integrator takes place during a greater or lesser fraction of the time interval $T_6$, either by means of the voltage $V_R$ if V is negative, or by means of the voltage $-V_R$ if V is positive. It terminates at the latest at the instant $t_{10}$. In order to determine the sign of V, two comparators 18 and 19 are used. The "+" (no inversion) input of the comparator 18 is connected to the terminal 17 as also is the "–" input (inverted) of the comparator 19. The – input of the comparator 18 and the + input of the comparator 19, are both grounded. Each of the comparators produces a level "1" signal as soon as the signal applied to its + input slightly exceeds the signal applied to its – input, and produces the level zero signal if the contrary is the case. All the comparators utilised in this circuit will be of the same type.

Two AND gates 20 and 21 have their first inputs connected respectively to the outputs of the comparator 18 and 19; their second inputs receive the signal $T_5$. The outputs of the gates 20 and 21 are respectively connected to the inputs 1, and 0 of a bistable trigger circuit 26, those inputs being used for causing the trigger circuit to pass to its 1 and 0 states.

Two AND gates 227 and 228, with four inputs, are supplied at their first inputs with the signal $T_6$. The third input of the gate 228 is connected to the output of the comparator 18 and the third input of the gate 227 to the output of the comparator 19. The fourth input, which is inverted, of the gate 227 and the fourth input of the gate 228, are connected to the output of the trigger circuit 26. The second inputs, which are inverted, of these two gates are unblocked at all times, as will be seen hereinafter, when the amplitude of the sampled signal is lower than the threshold value A/16.

Thus, from the instant $t_6$, and at the longest up to the end of $T_6$, the gate 228 will produce a signal $\theta'_6$ if V is positive, the gate 227 then producing a zero signal.

Conversely, if V is negative, the gate 227 will produce a signal $\theta''_6$ while the gate 228 will produce a zero signal.

The outputs of the gates 228 and 227 are respectively connected to the control inputs of the switches 14 and 15 respectively through an OR-gate 52 and an OR-gate 51 respectively. Assuming V to be positive, the signal $\theta'_6$ closes the switch 14 at the instant $t_6$, connecting the voltage source $-V_R$ to the integrator, the discharge time constant being determined, as concernes the resistance factor thereof, by the resistance of resistor 11, during the time interval $T'_6$. At the instant $t_8$, the signal $T_8$ is applied by the programmer to the control input of the switch 22 so that the resistor 12 is shunted across the resistor 11. At the instant $t_9$, the signal $T_9$ is applied to the control input of the switch 23, so that the resistor 13 is shunted across the resistor 11, in place of the resistor 12. Thus, three successive discharge time constants are obtained.

Referring to FIG. 2, where the law of FIG. 1 between the points o and c has been shown, and considering now the abscissae axis as the axis plotting the quantity $W = V - v$, where V is the final value of the output signal from the integrator during charging and v the instantaneous value of this output signal, this being indicated by the symbol (W), and the ordinate axis no longer as the axis plotting the compressed amplitudes A' but as a time axis $t$, this being expressed by the notation ($t$), it will be observed that if the constants of the integrator are chosen so that discharge takes place in accordance with the law $W = F(t)$ defined by this characteristic with the new axes, the duration of the discharge corresponding to a real amplitude A will be proportional to the corresponding compressed amplitude A'. This duration can be measured and, the compressed signal directly coded by supplying a seven-stage counter 232 with clock pulses H of frequency $F_o$, delivered by the programmer 39, If $F_o$ is made equal (expressed in kHz) to 64/4D, D being expressed in milliseconds, the counter 232 will then, when the integrator has practically discharged, display the coded binary number N to be transmitted. To this end, the outputs of the gates 228 and 227 respectively supply, through the OR gates 52 and 51, the two inputs of an OR gate 53 whose output is connected to the first input of an AND gate 54 whose second input is supplied with the clock pulses H coming from the programmer, and whose output is connected to the input of the counter 232 reset to zero by the pulse $T_{15}$ of the preceding sampling cycle. If V is positive, it is the gate 228 which opens to supply the counter 232 and the supply is maintained for as long as the gate 228 is not blocked by a change to the zero state on the part of the output signal from the comparator 18, i.e. in other words when the discharge has been completed. If V is negative, discharge is produced by means of the reference voltage $+V_R$ (introduced into circuit by the signal $\theta''_6$ from the gate 227) and the supply to the counter is then enabled by the AND gate 227.

Between the end of the discharge phase and the end of the time interval $T_6$, the terminal 10 of the integrator is grounded in order to prevent it integrating parasitic signals, the switch 16 being supplied to this end, at its control input, with the output signal from an AND gate 45 whose input is supplied with the signal $T_6$ and whose second (inverted) input is connected to the output of the gate 53.

At the instant $t_{14}$, the signal $T_{14}$ is applied to the record input of a shift register 235 having eight stages, the seven first inputs of which are connected to the outputs of the counter and the eighth input of which is connected to the output of the trigger circuit 26. The register 235 is supplied at its shift input with the output pulses from an AND gate 236 supplied on the one hand with the clock pulses and on the other with the signal $T_{15}$ whose duration is such that it ensures the emptying of the register at its output which constitutes the output of the coder compressor.

The circuit shown in FIG. 3, comprises a second integrator which, disregarding the values of the elements and in particular the resistances and the capacitance, and disregarding, too, the fact that it comprises two additional resistors which can be shunted across the first discharge resistor by means of switches, has a structure identical to that of the first integrator and can be connected in the same way to the terminal 5, to the voltage source $+V_R$, to the voltage source $-V_R$, and to ground, by means of switches. Similarly, two comparators are interconnected in the same way with the output of the second integrator and ground, as are the two comparators 18 and 19 of the first circuit.

An element which in the second circuit corresponds to a similar element in the first, is marked by the same reference number increased by 100. The third and fourth resistors, which may be shunted across the first discharge resistor 111 of the second integrator, not having any counter-parts in the first integrator, have been marked by the references 213 and 313, the associated switches being marked by the references 223 and 323.

During the time interval $T_o$ of each sampling period of a cycle, the switches 6 and 106 are closed by the signal $T_o$ and the two integrators charge, the constants being determined so that the proportionality coefficient between the charge and the input signal, at the instant $t_6$, is 16 times lower in the second integrator, than in the first.

At the instant $t_5$, the sign common to the output signals V and V' from the two integrators is recorded in the trigger circuit 26, this "sign trigger circuit" being used for both modes of operation.

In order to determine which integrator is used for the coding operation, the output 117 of the second integrator supplies, in addition to the comparators 118 and 119, two other comparators 40 and 41. The output 117 is connected to the + input of the comparator 40 and the − input of the comparator 41; the − input of the comparator 40 and the + input of the comparator 41 are respectively connected to a voltage source $+v'_c$ and a voltage source $-v'_c$. The outputs of the two comparators 40 and 41 supply the two inputs of an OR gate, 47, the output of which is connected to the first input of an AND gate, 42. The second input of this gate 42 is supplied with the signal $T_5$ is connected to the first input of a circuit 44, the second input of which receives the signal $T_{15}$, the latter and the output signal from the gate 42 respectively causing the trigger circuit to pass to its 1 and 0 states. If, at the instant $t_5$ the charge $v'$ on the second integrator exceeds $v'_c$ in absolute value, the trigger stage 44 changes to the 1 state; otherwise, it remains in the 0 state. The charge on the first integrator is limited by a conventional device, not shown, for example by a Zener diode, in order that said charge cannot acquire an impermissible level either in respect of the integrator or in respect of the comparators following it, in the case of the high-level signals being processed by the second integrator.

The signals $\theta'_6$ or $\theta''_6$ which cover the discharge time in the second integrator, are produced in the following fashion:

Two gates 327 and 328, interconnected with the elements 118, 119 and 26 in the same way as the gates 227 and 228 are interconnected with the elements 18, 19 and 26 in the first integrator, are associated with the second integrator. The four gates, through their second inputs, are supplied with the output signal from the trigger circuit 44, the gates 227 and 228, with inversion and the gates 327 and 328 without inversion, these latter therefore supplying the signal $\theta'_6$ or $\theta''_6$ if the second integrator is to be used. The outputs of the gates 327 and 328 respectively supply the second inputs of the OR gates 51 and 52 and those gates thus allow for the counter 232 to be supplied with the pulses H, in the same way as the gates 227 and 228. It will be observed that only one of the gates 227, 228, 327, 328 supplies a signal, this as a function of the sign of the sampled voltage and of the integrator being used.

Thus, operation of the integrator which is not being used, during the period of discharge, has no effect on the result recorded by the counter 232. This is why the output of the gate 52 can be connected simultaneously to the control inputs of the two switches 14 and 114, and that of the gate 51 to the control inputs of the switches 15 and 115.

For a similar reason, the output signal from the gate 45 which receives the signal $T_6$ and, in inverted form, the output signal from the gate 53, is applied simultaneously to the switches 16 and 116, this gate 45 playing the same part in respect of both the integrators.

If the second integrator is being used, the connections of the resistors in the first integrator are made as before, but the latter integrator plays no part as far as the formation of the digital output signal is concerned.

The discharge in the second integrator, should, by the hypothesis adopted, simply produce quantising steps ranging between 64 and 128. Thus, the part $c'$ $b'a'$ O $a$ $b$ $c$ of the law plotted in FIG. 1, here considered as a law $W=F(t)$, can be replaced by the segment $c'$ O c shown in dotted line in FIG. 1. During the initial period 4D, between $t_6$ and $t_{10}$, of the corresponding discharge comprising the intervals $T'_6$, $T_8$ and $T_9$, discharge therefore takes place linearly with a time constant which is determined by the resistance of resistor 111, in order to enable 64 clock pulses to be counted, taking into account the frequency of these pulses.

Then, during each of the intervals of duration D, which follow, the rate of discharge is progressively increased as a function of the slopes of the signal $cd$, $de$, $ef$, $fg$, in relation to the $t$ axis (FIG. 1), by successively and selectively connecting the resistor 112, then the resistor 113, then the resistor 213, then the resistor 313, across the resistor 111, with the help of the signals $T_{10}$, $T_{11}$, $T_{12}$, $T_{13}$, successively applied to the control inputs of the switches 122, 123, 223 and 323.

At the end of the time interval $T_6$, whichever of the integrators has been used, the correct number of pulses will therefore have been supplied to the counter 232, and this number will be recorded in the register 235 by the signal $T_{14}$. The signal $T_{15}$ is then applied to the zeroing input of the trigger stage 44 and the zeroing input of the counter 232.

It will be observed that the output signal from the coder-compressor covers only a small part of the sampling period or cycle, and this is something which is necessary of course if time-division multiplexing of several channels is envisaged. In the case where several coders of the kind hereinbefore described, are combined in the same piece of equipment, in order to effect the coding of different channels, it is possible to commonise part of the equipment.

On the other hand, the proposed solutions can be extended to any coding curve or graph which is approximated to by a succession of linear segments having given slope ratios with one another. However, the design is very substantially simplified if the successive segments are in slope ratios of 2 or ½.

Of course, the invention is not limited to the embodiment described and shown which were given selely by way of example.

What is claimed, is:

1. An analogue-digital converter for coding an analogue signal and simultaneously compressing it according to a compression characteristic $A'=f(A)$, where A is the amplitude to be coded and compressed, and A' the value of the corresponding coded signal, said characteristic being formed by a succession of straight line segments having $q$ different slopes, $q$ being an integer greater than $p$, the latter being an integer greater than one, and the segments having the $p$ steepest slopes corresponding to those amplitudes A which are, in absolute value, smaller than a threshold value, said analogue-digital converter comprising:

a first arrangement, including an integrator having an output, for, during first recurrent predetermined time intervals, sampling said analogue signal and charging said integrator proportionally to the amplitude of the sampled analogue signal, at least if the absolute value of this amplitude is not higher than said threshold value, with a first proportionality coefficient; means, for, in the course of further time intervals respectively following said first time intervals, non-linearly discharging said integrator as a function of time through modifying the discharge time constant of said integrator according to a predetermined programme so that the discharge time be proportional to the value A' corresponding to the amplitude of the sampled analogue signal, at least if the absolute value of this amplitude is not higher than said threshold value, with a second proportionality coefficient;

a second arrangement including a further integrator having an output, means for, during said first time intervals, sampling said analogue signal and charging said further integrator proportionally to the amplitude of the sampled analogue signal with a third proportionality coefficient smaller than said first proportionality coefficient; means, for in the course of said further time intervals, non-linearly discharging said further integrator as a function of time, through modifying the discharge time constant of said further integrator according to a further predetermined programme so that the discharge time be proportional to the value A' corresponding to the amplitude of the sampled analogue signal at least if the absolute value of this amplitude is higher than said threshold value, with a proportionality coefficient equal to said second proportionality coefficient;

pulse counting means, including a pulse generator for delivering pulses at a fixed frequency and a counter;

control means, coupled to the output of one of said integrators, for causing the feeding of said pulses to said counter during the discharge time of said further integrator or of said integrator of said first arrangement according to whether the absolute value of the charge of that integrator to the output of which said control means are coupled has or has not reached, at the end of the time interval during which said two integrators were charged, a limiting value indicating that the absolute value of the amplitude of the corresponding sampled analogue signal was at least equal to said threshold value.

2. An analogue digital converter as claimed in claim 1, wherein said control means are coupled to the output of said further integrator, and wherein said limiting value is proportional, with said third proportionality coefficient, to said threshold value.

3. An analogue digital converter as claimed in claim 1, wherein a single time constant is used in said further programme for the initial part of the discharge corresponding to the discharge of the charge taken by said further integrator for an amplitude of the sampled analogue signal equal, in absolute value, to said threshold value.

4. An analogue-digital converter as claimed in claim 1 for coding an analogue signal whose amplitude is alternately positive and negative, further comprising additional means, coupled to the output of one of said integrators, for determining the sign of the charge thereof; and means, coupled to said additional means for adding a sign signal to the output signal of said counter; said additional means being coupled to said means for discharging said integrator of said first arrangement and to said means for discharging said further integrator, for determining the sign of the discharge voltage applied to said integrators.

* * * * *